United States Patent
Matsui

(10) Patent No.: US 10,951,174 B2
(45) Date of Patent: Mar. 16, 2021

(54) HIGH-FREQUENCY AMPLIFIER

(71) Applicant: Mitsubishi Electric Corporation, Tokyo (JP)

(72) Inventor: Toshio Matsui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 152 days.

(21) Appl. No.: 16/304,708

(22) PCT Filed: Oct. 24, 2016

(86) PCT No.: PCT/JP2016/081406
§ 371 (c)(1),
(2) Date: Nov. 27, 2018

(87) PCT Pub. No.: WO2018/078686
PCT Pub. Date: May 3, 2018

(65) Prior Publication Data
US 2020/0274497 A1 Aug. 27, 2020

(51) Int. Cl.
*H03F 1/26* (2006.01)
*H01L 23/29* (2006.01)
(Continued)

(52) U.S. Cl.
CPC ............. *H03F 1/26* (2013.01); *H01L 23/295* (2013.01); *H01L 23/3121* (2013.01);
(Continued)

(58) Field of Classification Search
CPC ... H01L 23/28–3192; H01L 21/56–568; H01L 2924/181–186; H01L 24/48;
(Continued)

(56) References Cited

U.S. PATENT DOCUMENTS 5,757,082 A 5/1998 Shibata
8,012,868 B1 9/2011 Naval et al.
(Continued)

FOREIGN PATENT DOCUMENTS

CN 1291492 C 12/2006
JP S64-050470 A 2/1989
(Continued)

OTHER PUBLICATIONS

International Search Report issued in PCT/JP2016/081406; dated Dec. 27, 2016.
(Continued)

*Primary Examiner* — Tucker J Wright
(74) *Attorney, Agent, or Firm* — Studebaker & Brackett PC

(57) ABSTRACT

A transistor (2) is provided on a surface of a semiconductor substrate (1). First and second wirings (10,11) are provided on the surface of the semiconductor substrate (1) and sandwich the transistor (2). Plural wires (20) pass over the transistor (2) and are connected to the first and second wirings (10,11). A sealing material (21) sealing the transistor (2), the first and second wirings (10,11), and the plural wires (20). The sealing material (21) contains a filler (21a). An interval distance between the plural wires (20) is smaller than a particle diameter of the filler (21a). The sealing material (21) does not intrude into a space between the plural wires (20) and the transistor (2) so that a cavity (22) is formed.

6 Claims, 12 Drawing Sheets

(51) Int. Cl.
*H01L 23/31* (2006.01)
*H01L 23/66* (2006.01)
*H01L 23/00* (2006.01)
*H03F 3/193* (2006.01)
*H01L 21/56* (2006.01)
*H01L 23/495* (2006.01)

(52) U.S. Cl.
CPC .............. *H01L 23/66* (2013.01); *H01L 24/48* (2013.01); *H01L 24/49* (2013.01); *H03F 3/193* (2013.01); *H01L 21/56* (2013.01); *H01L 23/49541* (2013.01); *H01L 2223/6611* (2013.01); *H01L 2223/6644* (2013.01); *H01L 2224/4813* (2013.01); *H01L 2224/48091* (2013.01); *H01L 2224/48175* (2013.01); *H01L 2224/49176* (2013.01); *H01L 2924/13064* (2013.01); *H01L 2924/30105* (2013.01)

(58) Field of Classification Search
CPC .............. H01L 24/49; H01L 2223/6611; H01L 2223/6644; H01L 2224/48091; H01L 2224/4813; H03F 3/193; H03F 1/26

See application file for complete search history.

(56) References Cited

U.S. PATENT DOCUMENTS

| | | |
|---|---|---|
| 8,637,975 B1 | 1/2014 | Liou |
| 2004/0021156 A1 | 2/2004 | Asano et al. |
| 2010/0171211 A1 | 7/2010 | Jao et al. |
| 2016/0211222 A1 | 7/2016 | Kuo et al. |

FOREIGN PATENT DOCUMENTS

| | | |
|---|---|---|
| JP | H04-165655 A | 6/1992 |
| JP | H09-045723 A | 2/1997 |
| JP | 2004-006816 A | 1/2004 |
| JP | 2004-128125 A | 4/2004 |
| JP | 2004-289869 A | 10/2004 |
| JP | 2012-164852 A | 8/2012 |

OTHER PUBLICATIONS

Written Opinion issued in PCT/JP2016/081406; dated Dec. 27, 2016.
Notification of Transmittal of the International Search Report and the Written Opinion of the International Searching Authority, or the Declaration issued in PCT/JP2016/081406; dated Dec. 27, 2016.
An Office Action; "Notification of Reasons for Refusal," issued by the Japanese Patent Office dated Feb. 21, 2017, which corresponds to Japanese Patent Application No. 2017-503024.
An Office Action; "Notification of Reasons for Refusal," issued by the Japanese Patent Office dated Jun. 20, 2017, which corresponds to Japanese Patent Application No. 2017-503024.
An Office Action issued by the Taiwanese Patent Office dated Dec. 28, 2017, which corresponds to Taiwanese Patent Application No. 105140209.

HIGH-FREQUENCY AMPLIFIER

FIELD

The present invention relates to a high-frequency amplifier including a wire.

BACKGROUND

It has been necessary in high-frequency amplifiers to reduce the floating capacitance generated between the drain and the gate of an FET. Therefore, a structure in which a cavity is provided above an FET by using a metal frame and a metal cap has been used. Furthermore, a structure in which resin having a low dielectric constant is coated on the FET to reduce a parasitic capacitance has been also used. However, the effect of reducing the parasitic capacitance is smaller than that of the former structure. Also, the stricture of the metal cap of the former structure has a shielding effect, and also has an effect of suppressing radiation noise of the FET.

It has been also disclosed that the floating capacitance between the gate and the drain is reduced with the shielding effect by providing a wire between the gate and the drain (for example, see PTL 1). Furthermore, it has been disclosed that the floating capacitance is reduced by providing a metal above the FET plate with a gap of 0.2 µm or less therebetween to provide a cavity above the FET (for example, see PTL 2).

CITATION LIST

Patent Literature

[PTL 1] JP H04-165655 A
[PTL 2] JP 2004-6816 A

SUMMARY

Technical Problem

For example, in order to enhance the high frequency characteristics of a high electron mobility transistor (HEMT: high electron mobility transistor) and obtain a sufficient power gain, it is required that a cavity or a low dielectric constant layer be provided above an FET so that floating capacitance between the gate and the drain is reduced. Furthermore, from the viewpoint of the cost, the number of materials and the manufacturing process, a structure in which wires connected to a semiconductor chip are sealed with thermosetting resin is used. However, in terms of characteristics, it is better to use a hollow structure in which a cavity is provided above a transistor by using a metal frame and a metal cap.

The present invention has been made to solve the problem as described above, and has an object to provide a high-frequency amplifier capable of reducing the floating capacitance between a gate electrode and a drain electrode and suppressing radiation noise of a transistor.

Solution to Problem

A high-frequency amplifier according to the present invention includes: a semiconductor substrate; a transistor provided on a surface of the semiconductor substrate and having a gate electrode, a source electrode and a drain electrode; first and second wirings provided on the surface of the semiconductor substrate and sandwiching the gate electrode, the source electrode and the drain electrode; plural wires passing over the gate electrode, the source electrode and the drain electrode and connected to the first and second wirings; and a sealing material sealing the transistor, the first and second wirings, and the plural wires, wherein the sealing material contains a filler, an interval distance between the plural wires is smaller than a particle diameter of the filler, and the sealing material does not intrude into a space between the plural wires and the transistor so that a cavity is formed.

ADVANTAGEOUS EFFECTS OF INVENTION

In the present invention, the plural wires pass over the source electrode and the drain electrode and are connected to the first and second wirings. An interval distance between the plural wires is smaller than a particle diameter of the filler. Therefore, the sealing material does not intrude into a space between the plural wires and the transistor so that a cavity is formed. This cavity can reduce the floating capacitance between the gate electrode and the drain electrode. Furthermore, by covering the upper side of the transistor with the plural wires, it is possible to suppress radiation noise.

DESCRIPTION OF EMBODIMENTS

A high-frequency amplifier according to the embodiments of the present invention will be described with reference to the drawings. The same components will be denoted by the same symbols, and the repeated description thereof may be omitted.

First Embodiment

Figure 1:
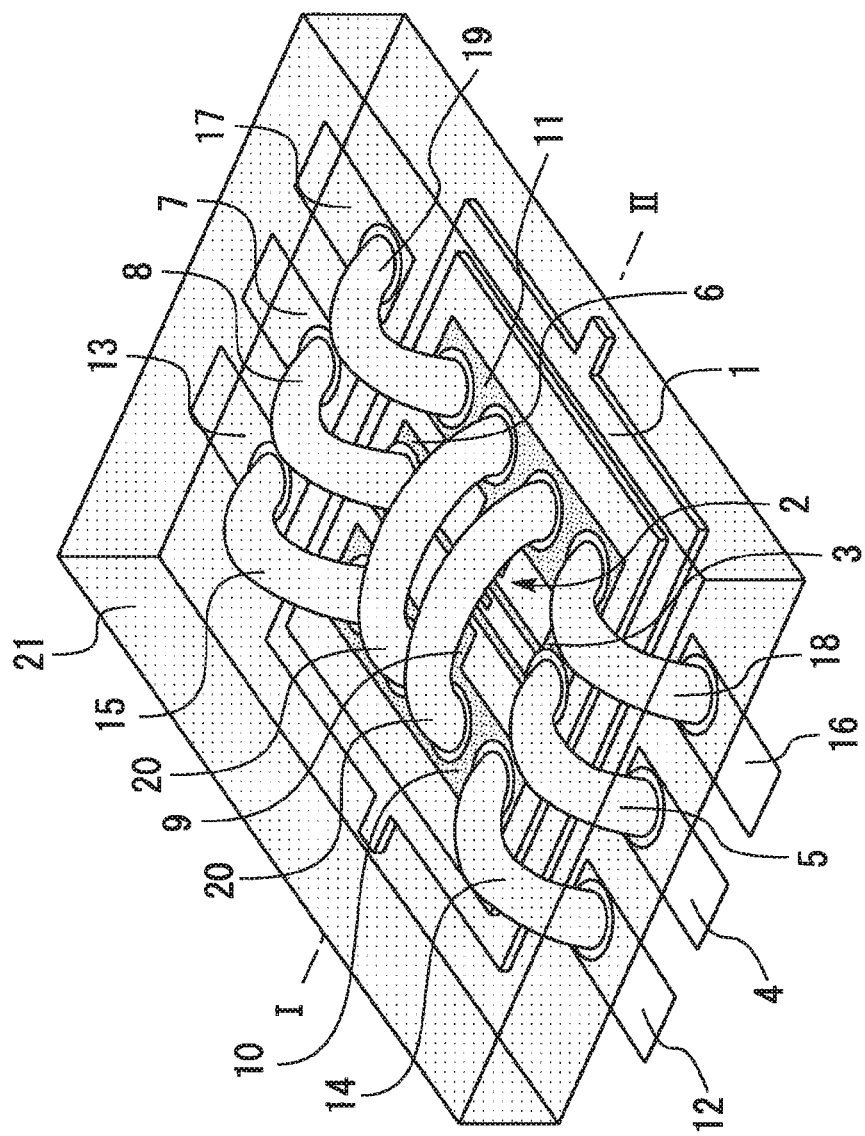
FIG. 1 is a perspective view showing the inside of a high-frequency amplifier according to a first embodiment of the present invention.
Figure 2:
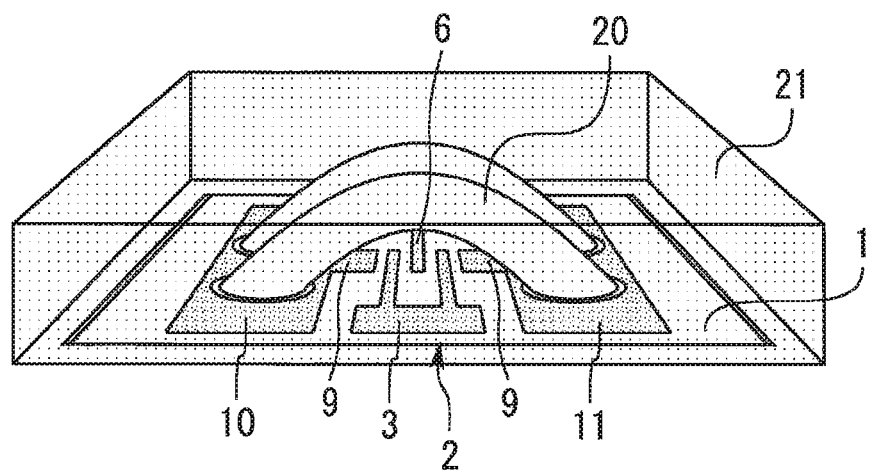
FIG. 2 is a perspective view showing the inside of a high-frequency amplifier according to a first embodiment of the present invention.
Figure 3:
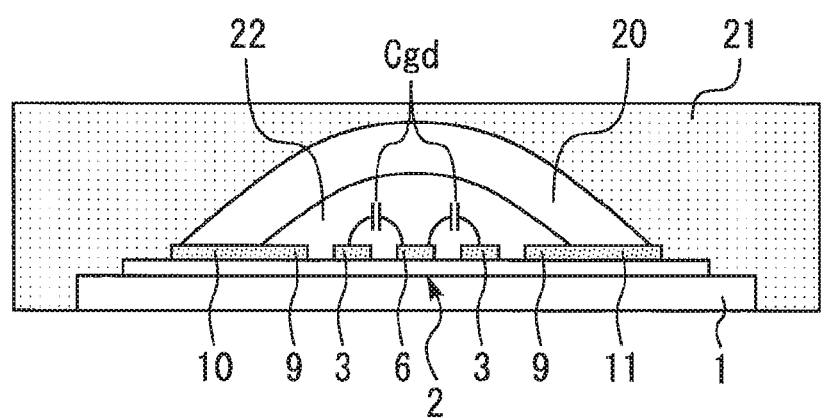
FIG. 3 is a cross-sectional view taken along I-II of FIG. 1.

FIGS. 1 and 2 are perspective views showing the inside of a high-frequency amplifier according to a first embodiment of the present invention. FIG. 3 is a cross-sectional view taken along I-II of FIG. 1.

A transistor 2 is formed on the surface of a semiconductor substrate 1. A gate electrode 3 of the transistor 2 and a lead frame 4 are connected to each other by a gate wire 5. A drain electrode 6 of the transistor 2 and a lead frame 7 are connected to each other by a drain wire 8. A source electrode 9 of the transistor 2 is connected to source wirings 10 and 11. The source wiring 10 is connected to lead frames 12 and 13 by source wires 14 and 15, respectively. The source wiring 11 is connected to lead frames 16 and 17 by source wires 18 and 19, respectively.

The source wirings 10 and 11 are formed on the surface of the semiconductor substrate 1 so as to sandwich the transistor 2 therebetween. Plural wires 20 pass over the transistor 2, and are connected to the source wirings 10 and 11. A sealing material 21 seals the transistor 2, the source wirings 10 and 11, the plural wires 20, and the like. A cavity 22 into which the sealing material 21 does not intrude is formed between the plural wires 20 and the transistor 2.

Figure 4:
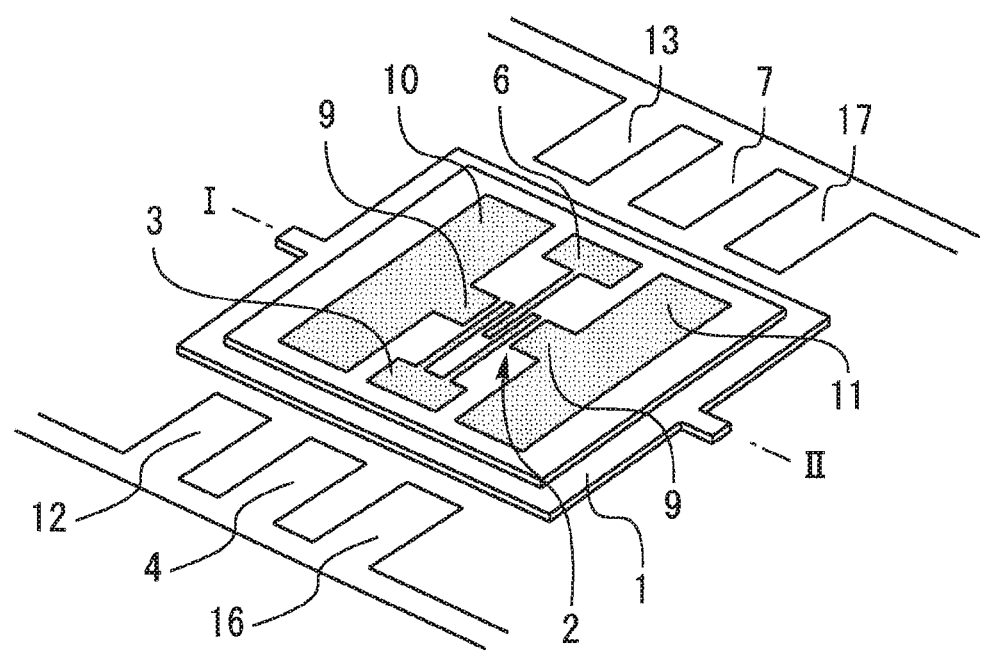
FIG. 4 is a perspective view showing a manufacturing process of the high-frequency amplifier according to the first embodiment of the present invention.
Figure 12:
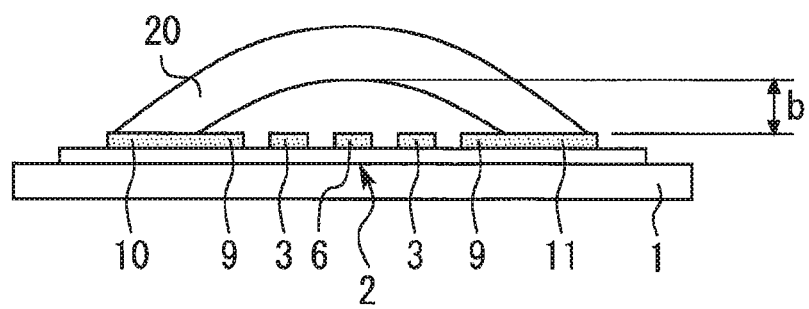
FIG. 12 is a cross-sectional view showing the manufacturing process of the high-frequency amplifier according to the first embodiment of the present invention.
Figure 13:
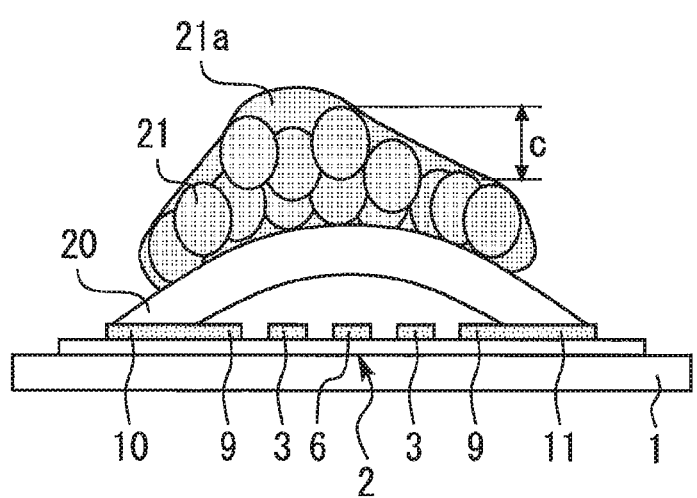
FIG. 13 is a cross-sectional view showing the manufacturing process of the high-frequency amplifier according to the first embodiment of the present invention.

FIGS. 4, 5 and 7 to 11 are perspective views showing a manufacturing process of the high-frequency amplifier according to the first embodiment of the present invention. FIGS. 6, 12, and 13 are cross-sectional views showing the manufacturing process of the high-frequency amplifier according to the first embodiment of the present invention. FIG. 6 is a cross-sectional view taken along I-II of FIG. 4, and FIG. 12 is a cross-sectional view taken along I-II of FIG. 9.

Figure 5:
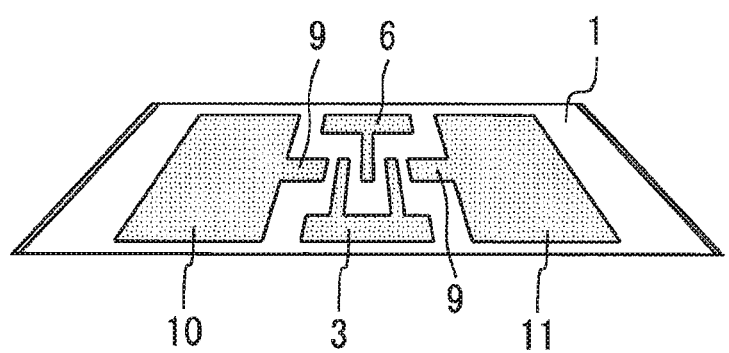
FIG. 5 is a perspective view showing a manufacturing process of the high-frequency amplifier according to the first embodiment of the present invention.
Figure 6:
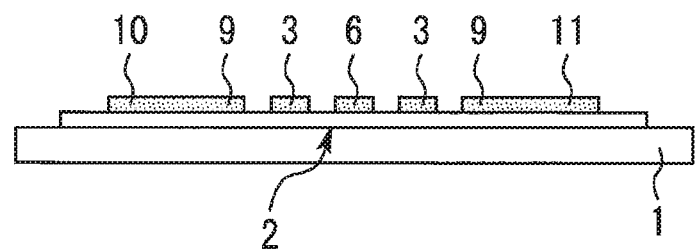
FIG. 6 is a cross-sectional view showing the manufacturing process of the high-frequency amplifier according to the first embodiment of the present invention.
Figure 7:
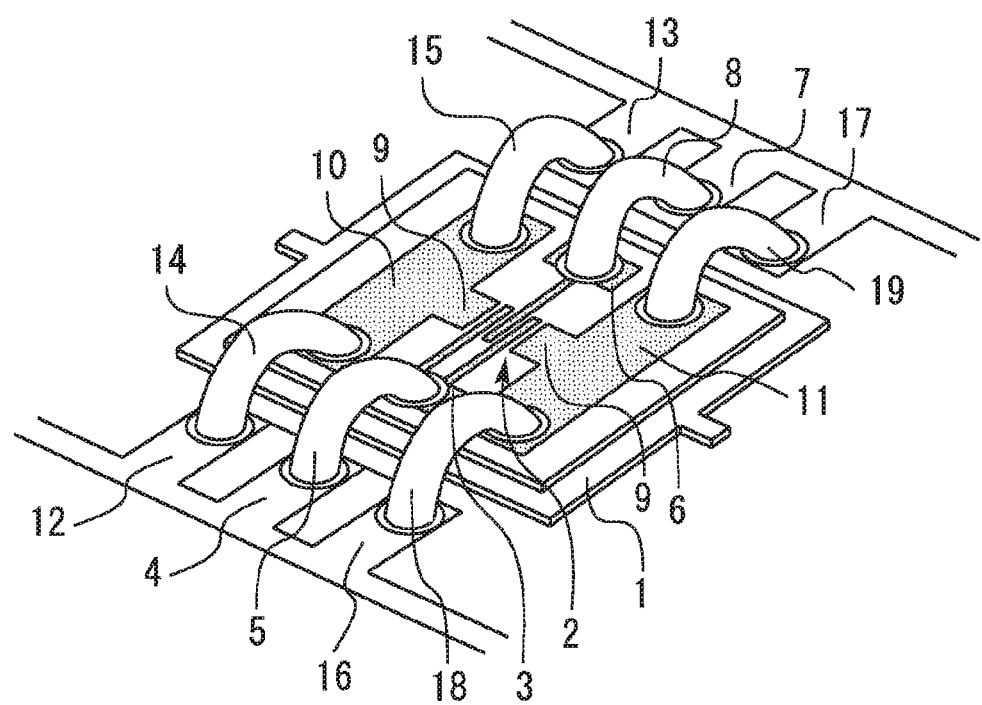
FIG. 7 is a perspective view showing a manufacturing process of the high-frequency amplifier according to the first embodiment of the present invention.
Figure 8:
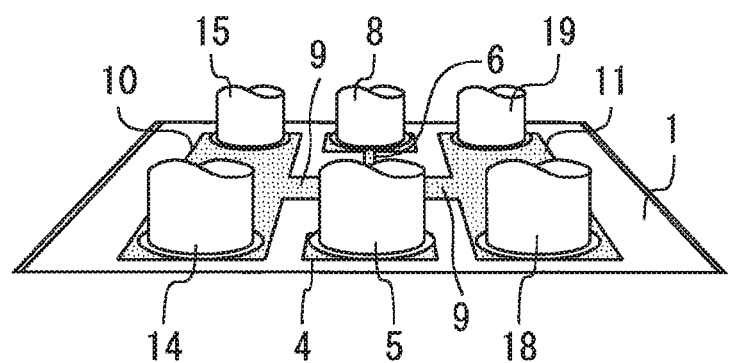
FIG. 8 is a perspective view showing a manufacturing process of the high-frequency amplifier according to the first embodiment of the present invention.
Figure 9:
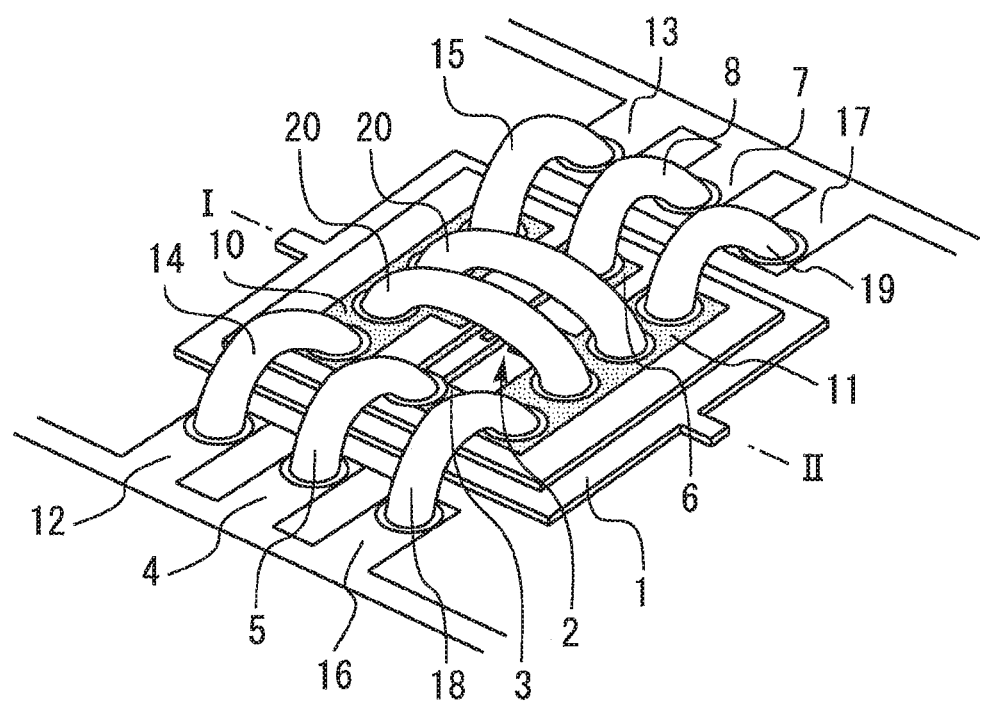
FIG. 9 is a perspective view showing a manufacturing process of the high-frequency amplifier according to the first embodiment of the present invention.
Figure 10:
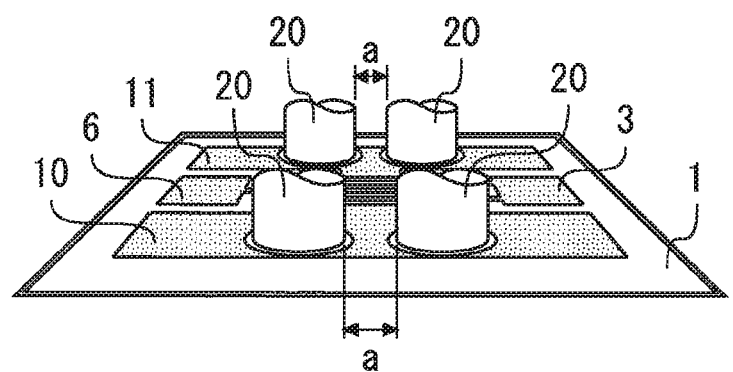
FIG. 10 is a perspective view showing a manufacturing process of the high-frequency amplifier according to the first embodiment of the present invention.
Figure 11:
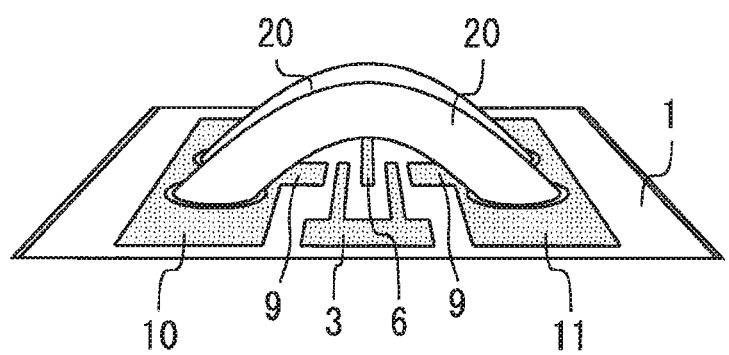
FIG. 11 is a perspective view showing a manufacturing process of the high-frequency amplifier according to the first embodiment of the present invention.

First, as shown in FIGS. 4 to 6, the transistor 2 is formed on the surface of the semiconductor substrate 1, and the lead frames 4, 7, 12, 13, 16, and 17 are arranged on the side of the transistor 2. Next, as shown in FIGS. 7 and 8, the gate electrode 3 of the transistor 2 and the lead frame 4 are connected to each other by the gate wire 5. The drain electrode 6 and the lead frame 7 are connected to each other by the drain wire 8. The source wiring 10 is connected to the lead frames 12 and 13 by the source wires 14 and 15, respectively. The source wiring 11 is connected to the source wires 18 and 19 by the lead frames 16 and 17, respectively. Next, as shown in FIGS. 9 to 12, the plural wires 20 pass over the transistor 2, and are connected to the source wirings 10 and 11.

Next, the transistor 2, the source wirings 10 and 11, the plural wires 20 and the like are sealed with the sealing material 21. The sealing material 21 is epoxy resin containing fillers 21a of silica, and thermosetting resin having high hitting viscosity is used within a usable range. The interval distance a between the plural wires 20 is smaller than the particle diameter c of the tillers 21a. Therefore, as shown in FIG. 13, when the sealing material 21 is coated, the sealing material 21 does not intrude into the spaces between the plural wires 20 and the transistor 2, so that the cavity 22 is formed.

When a low noise FET is taken as an example of the transistor 2, the size of the transistor 2 is equal to 140 μm×140 μm. The diameter of each of the gate wire 5, the drain wire 8, the source wires 14, 15, 18 and 19, and the plural wires 20 is equal to 20 μm. The interval distance a between the plural wires 20 is equal to 30 μm or less, and the height b of the plural wires 20 is equal to 30 μm or less. The particle diameter c of the fillers 21a is larger than 30 μm.

The floating capacitance Cgd between the gate electrode 3 and the drain electrode 6 is determined by $Cgd=\varepsilon_0 \times \varepsilon_r \times (S/L)$. Here, $\varepsilon_0$ represents the permittivity of vacuum, $\varepsilon_r$ represents the relative permittivity, S represents the passing area between objects, and L represents the distance between the objects. The relative permittivity $\varepsilon_r$ of the sealing material 21 is equal to 3 to 4. The relative permittivity $\varepsilon_r$ of the cavity 22 is approximately equal to 1 of air. Accordingly, by providing the cavity 22 as in case of the present embodiment, the floating capacitance Cgd between the gate electrode 3 and the drain electrode 6 can be reduced to ⅓ to ¼ as compared with a case where the cavity 22 is not provided. The height b of the cavity 22 to obtain the effect of reducing the floating capacitance is not limited to a specific one.

Furthermore, since the transistor 2 and the outside are mutually shielded from each other with the plural wires 20 by covering the upper side of the transistor 2 with the plural wires 20, it is possible to suppress radiation noise in which radiation leaks from the transistor 2 to the outside.

Second Embodiment

Figure 14:
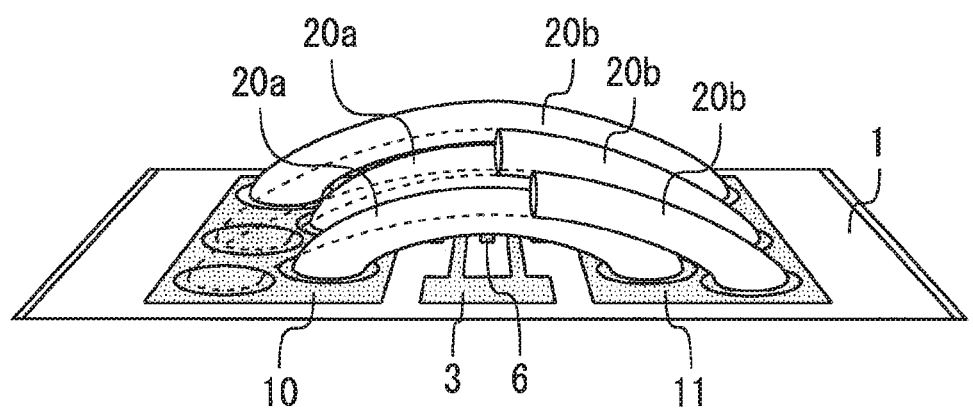
FIG. 14 is a perspective view showing the inside of a high-frequency amplifier according to a second embodiment of the present invention.
Figure 15:
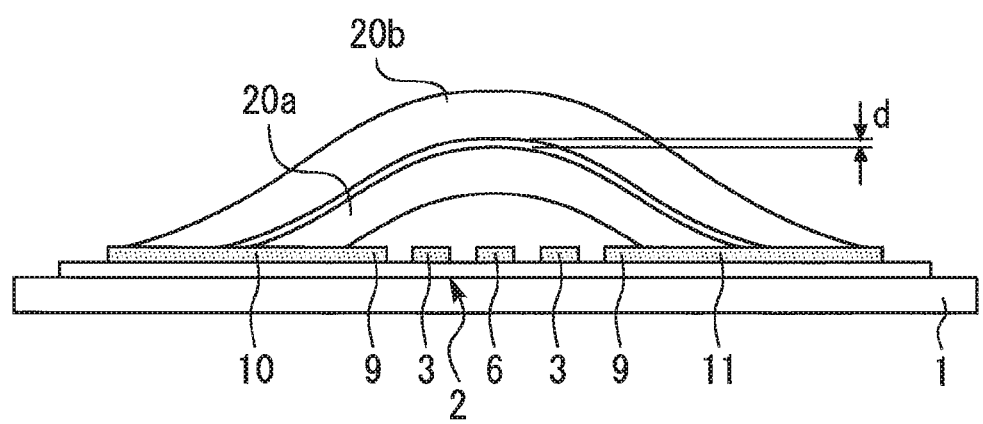
FIG. 15 is a cross-sectional view showing the inside of the high-frequency amplifier according to the second embodiment of the present invention.

FIG. 14 is a perspective view showing the inside of a high-frequency amplifier according to a second embodiment of the present invention. FIG. 15 is a cross-sectional view showing the inside of the high-frequency amplifier according to the second embodiment of the present invention. The sealing material 21 and the like are omitted from the illustration.

In the present embodiment, plural first wires 20a and plural second wires 20b arranged above the first wires 20a are used instead of the plural wires 20 of the first embodiment. The interval distance d between the plural first wires 20a and the plural second wires 20b is equal to or smaller than the particle diameter c of the fillers 21a so that the first and second wires 20a and 20b are not in contact with each other.

The plural second wires 20b are arranged in the gaps between the plural first wires 20a in plan view which is taken from a direction vertical to the surface of the semiconductor substrate 1. As a result, the gaps between the plural first wires 20a are embedded with the plural second wires 20b, and the wires above the transistor 2 are densified, so that an effect of shielding radio frequency interference between the transistor 2 and the outside is enhanced. Accordingly, the radiation noise in which the radiation of the transistor 2 leaks to the outside can be suppressed as compared with that in the first embodiment.

Third Embodiment

Figure 16:
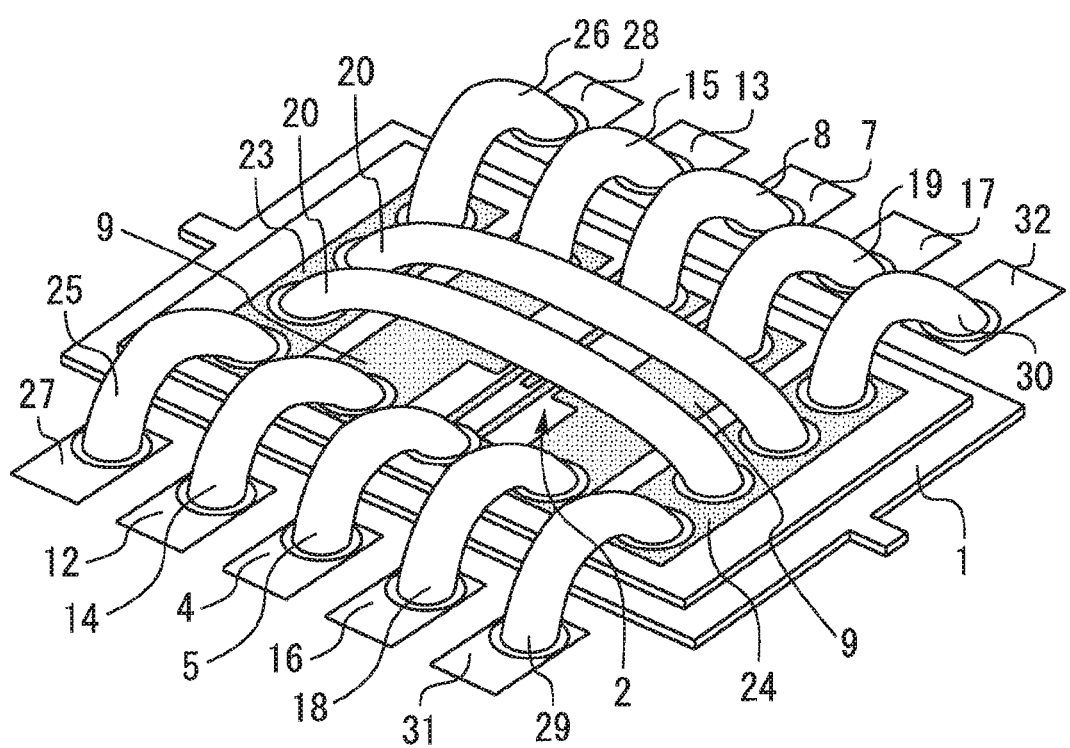
FIG. 16 is a perspective view showing the inside of a high-frequency amplifier according to a third embodiment of the present invention.
Figure 17:
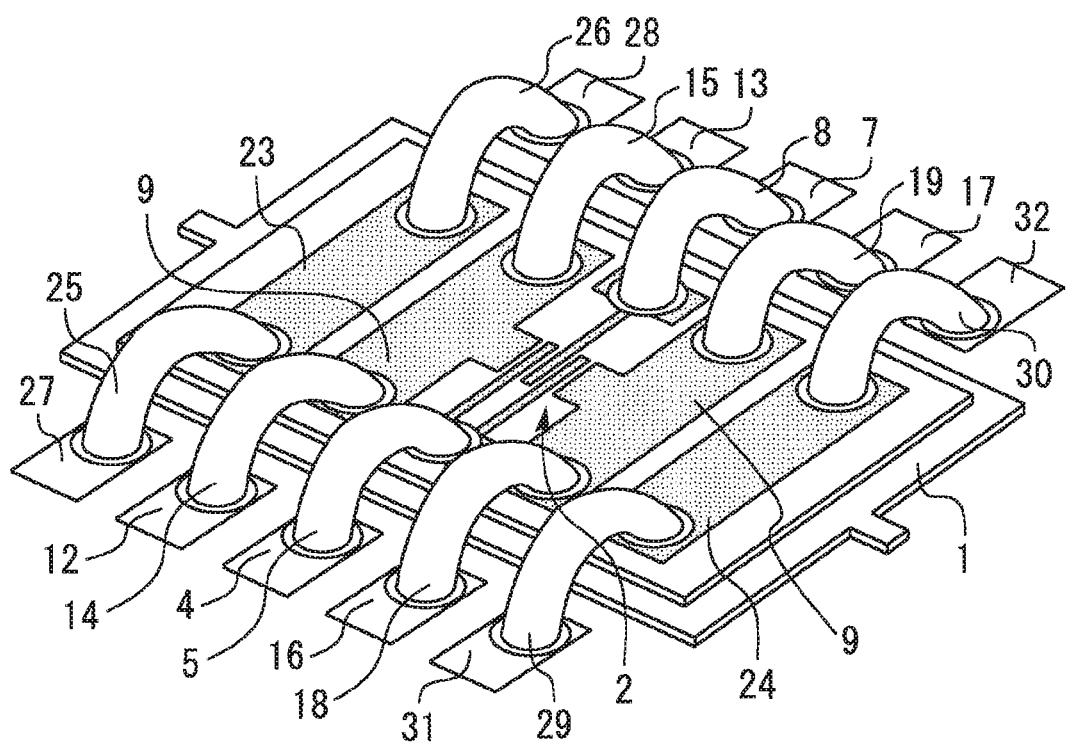
FIG. 17 is a perspective view showing the inside of a high-frequency amplifier according to a third embodiment of the present invention.
Figure 18:
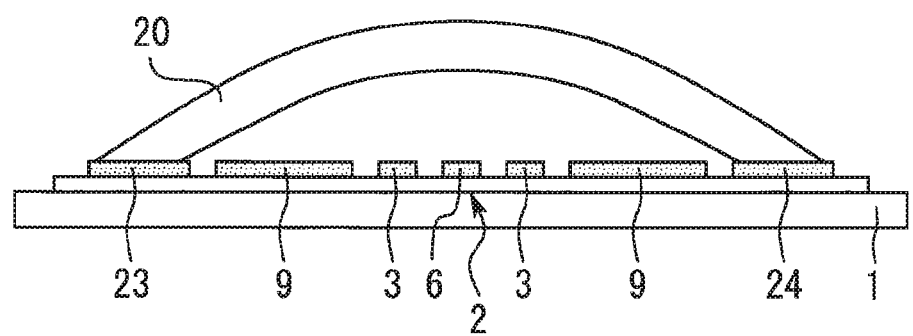
FIG. 18 is a cross-sectional view showing the inside of the high-frequency amplifier according to the third embodiment of the present invention.

FIGS. 16 and 17 are perspective views showing the inside of a high-frequency amplifier according to a third embodiment of the present invention. FIG. 18 is a cross-sectional view showing the inside of the high-frequency amplifier according to the third embodiment of the present invention. The plural wires 20 are omitted in FIG. 17. The sealing material 21 and the like are omitted from the illustration.

Ground wirings 23 and 24 which are independent from the source electrode 9 of the transistor 2 are provided. The ground wirings 23 and 24 are arranged outside the source electrode 9, and are not connected to the source electrode 9. The plural wires 20 pass over the transistor 2, and are connected to the ground wirings 23 and 24. The ground wiring 23 is connected to lead frames 27 and 28 by wires 25 and 26, respectively. The ground wiring 24 is connected to lead frames 31 and 32 by wires 29 and 30, respectively.

Since the plural wires 20 are arranged at low position to prevent intrusion of the sealing material 2, a slight floating capacitance is generated between the gate electrode 3 or the drain electrode 6 and the plural wires 20. Accordingly, when the plural wires 20 are connected to the source wirings 10 and 11 as in the case of the first and second embodiments, the source voltage may vary during the operation of the transistor 2 to fluctuate the floating capacitance Cgd between the gate electrode 3 and the drain electrode 6, so that the electric characteristics of the transistor 2 are influenced. In order to suppress this, in the present embodiment, the plural wires 20 are connected to the ground wirings 23 and 24 which are independent of the source electrode 9 of the transistor 2. As a result, it is possible to suppress the influence of the voltage variation of the source wirings 10 and 11 with respect to the floating capacitance between the gate electrode 3 or the drain electrode 6 and the plural wires 20.

Fourth Embodiment

Figure 19:
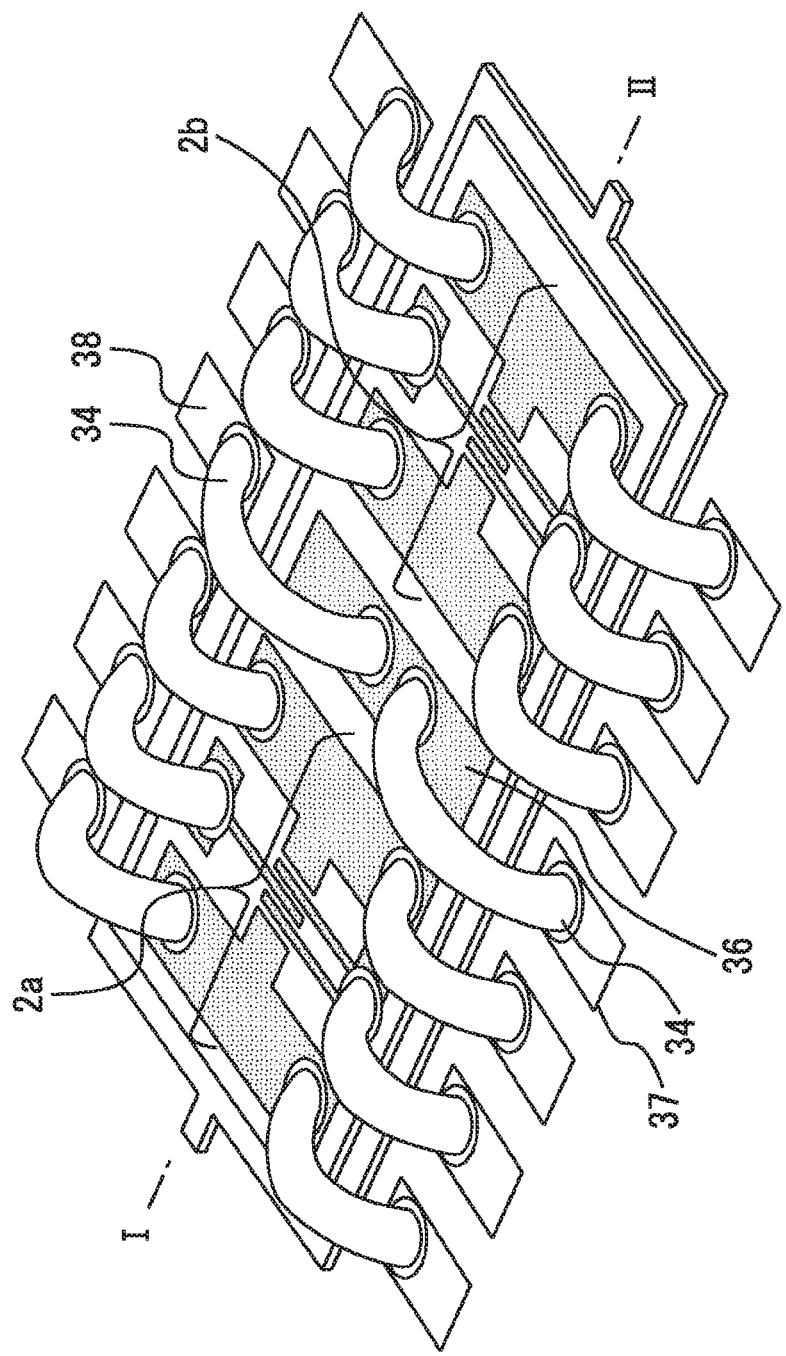
FIG. 19 is a perspective view showing the inside of a high-frequency amplifier according to a fourth embodiment of the present invention.
Figure 20:
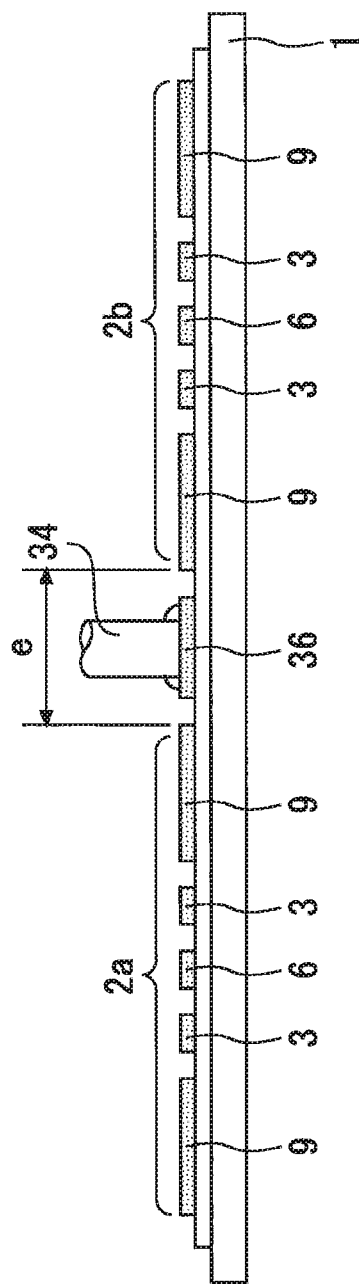
FIG. 20 is a cross-sectional view taken along I-II of FIG. 19.

FIG. 19 is a perspective view showing the inside of a high-frequency amplifier according to a fourth embodiment of the present invention. FIG. 20 is a cross-sectional view taken along I-II of FIG. 19. Two first and second transistors 2a and 2b which are apart from each other are formed on the surface of one semiconductor substrate 1. In this case, when the interval distance e between the first and second transistors 2a and 2b is short, for example, it is equal to about 40 μm, electric fields generated from the first and second transistors 2a and 2b mutual interfere with each other. In general, the mutual interference adversely affects the characteristics in many cases, and it is better to isolate these transistors from each other.

Therefore, in the present embodiment, wires 34 crossing between the first transistor 2a and the second transistor 2b are provided. An isolating wiring 36 is formed on the surface of the semiconductor substrate 1 between the first and second transistors 2a and 2b. The wires 34 are connected to the lead frame 37, the isolating wiring 36, and another lead frame 38. The wires 34 and the isolating wiring 36 are not connected to the first and second transistors 2a and 2b.

The wires 34 act as a radio wave shield to suppress mutual interference of the electric fields generated from the first and second transistors 2a and 2b. As a result, it is possible to suppress the adverse effect on the electrical characteristics of the first and second transistors 2a and 2b.

Note that the wires 34 may be connected to the other lead frame 38 across the space between the first transistor 2a and the second transistor 2b from the lead frame 37 without providing the isolating wiring 36.

REFERENCE SIGNS LIST 1 semiconductor substrate; 2 transistor; 2a first transistor; 2b second transistor; 3 gate electrode, 6 drain electrode; 9 source electrode; 10,11 source wiring; 20,34 wire; 20a first wire; 20b second wire; 21 sealing material; 21a filler; 22 cavity; 23,24 ground wiring; 36 isolating wiring

The invention claimed is:

1. A high-frequency amplifier comprising:
a semiconductor substrate;
a transistor provided on a surface of the semiconductor substrate and having a gate electrode, a source electrode and a drain electrode;
first and second wirings provided on the surface of the semiconductor substrate and sandwiching the gate electrode, the source electrode and the drain electrode;
plural wires passing over the gate electrode, the source electrode and the drain electrode and connected to the first and second wirings; and
a sealing material sealing the transistor, the first and second wirings, and the plural wires,
wherein the sealing material contains a filler,
an interval distance between the plural wires is smaller than a particle diameter of the filler, and
the sealing material does not intrude into a space between the plural wires and the transistor so that a cavity is formed.

2. The high-frequency amplifier according to claim 1, wherein the plural wires include plural first wires and plural second wires arranged above the plural first wires, and
the plural second wires are arranged in gaps between the plural first wires in plan view taken from a direction vertical to the surface of the semiconductor substrate.

3. The high-frequency amplifier according to claim 1, wherein the first and second wirings are connected to the source electrode.

4. The high-frequency amplifier according to claim 2, wherein the first and second wirings are connected to the source electrode.

5. The high-frequency amplifier according to claim 1, wherein the first and second wirings are independent of the source electrode.

6. The high-frequency amplifier according to claim 2, wherein the first and second wirings are independent of the source electrode.

* * * * *